US010527685B2

(12) United States Patent
Garofalo

(10) Patent No.: US 10,527,685 B2
(45) Date of Patent: Jan. 7, 2020

(54) CONTACTLESS DETECTION SYSTEM OF THE POSITION OF OBJECTS ON A SURFACE

(71) Applicant: XPLORED S.R.L., Genoa (IT)

(72) Inventor: Enrico Garofalo, Rapallo (IT)

(73) Assignee: XPLORED SRL, Genoa, GE (IT)

(*) Notice: Subject to any disclaimer, the term of this patent is extended or adjusted under 35 U.S.C. 154(b) by 0 days.

(21) Appl. No.: 15/571,391

(22) PCT Filed: May 3, 2016

(86) PCT No.: PCT/IT2016/000114
§ 371 (c)(1),
(2) Date: Nov. 2, 2017

(87) PCT Pub. No.: WO2016/178257
PCT Pub. Date: Nov. 10, 2016

(65) Prior Publication Data
US 2018/0356472 A1 Dec. 13, 2018

(30) Foreign Application Priority Data
May 5, 2015 (IT) .................. 102015902349505

(51) Int. Cl.
G01R 33/02 (2006.01)
G06K 7/10 (2006.01)
G06K 7/08 (2006.01)

(52) U.S. Cl.
CPC ............. *G01R 33/02* (2013.01); *G06K 7/087* (2013.01); *G06K 7/10366* (2013.01)

(58) Field of Classification Search
CPC ..... G01R 33/02; G06K 7/10366; G06K 7/087
See application file for complete search history.

(56) References Cited

U.S. PATENT DOCUMENTS 9,285,470 B2* 3/2016 Sanders .................. G01S 13/74
2001/0035815 A1 11/2001 Fletcher
(Continued)

FOREIGN PATENT DOCUMENTS

EP 2765468 A2 8/2014
EP 2884372 A1 6/2015

OTHER PUBLICATIONS

International Search Report of the ISA—EPO, dated Sep. 28, 2016.

Primary Examiner — Huy Q Phan
Assistant Examiner — Zannatul Ferdous
(74) Attorney, Agent, or Firm — Patshegen IP LLC; Moshe Pinchas

(57) ABSTRACT

Object of the present invention is a system for detecting the spatial position and tracking the movement of one or more objects provided with RFID Tags, said objects possibly being positionable on a suitable limited surface, which constitutes the test space. Such objective is achieved realizing a suitable sensorized test surface, on which elements provided with RFID identifier and magnetic marker can be positioned, possibly moved and monitored. Said surface houses a single RFID antenna dimensioned and positioned in such a way as to cover the entire area of interest, and able to read the tags of possible objects, coupled with a series of magnetic sensors, which are positioned in such a way as to ensure the coverage of the test area and whose measuring ranges may also be different according to the peculiarities of the areas of interest (overall area, precision of detection required, presence of particular areas of interest, etc.) and are partially overlapped. The localizable objects or elements are also provided, in addition to a unique identifier, or RFID Tag, with a suitable magnetic marker, adapted to interact with the above-mentioned grid of sensors. The analysis of the tagged objects, thus, occurs in two steps: the identification of the elements is carried out by means of RFID
(Continued)

techniques and, particularly, through the interaction between the Tag and the antenna, while the position and movement detection of the tagged elements is carried out by the proximity detection (with interpolation techniques) of the magnet placed on the traceable object and by means of magnetic sensors positioned on the surface.

4 Claims, 3 Drawing Sheets

(56) References Cited

U.S. PATENT DOCUMENTS

| | | | | |
|---|---|---|---|---|
| 2005/0280574 | A1* | 12/2005 | Tafas | B01L 3/545 |
| | | | | 342/126 |
| 2007/0285245 | A1* | 12/2007 | Djuric | G08B 13/1427 |
| | | | | 340/572.1 |
| 2008/0284600 | A1* | 11/2008 | Drzaic | A62B 99/00 |
| | | | | 340/572.1 |
| 2010/0141483 | A1 | 6/2010 | Thacher | |
| 2011/0181289 | A1 | 7/2011 | Rushing | |
| 2013/0328825 | A1 | 12/2013 | Brown | |

* cited by examiner

CONTACTLESS DETECTION SYSTEM OF THE POSITION OF OBJECTS ON A SURFACE

BACKGROUND ART

Over the years, the radio frequency identification technologies, commonly called RFID, have had a wide spread becoming the basic resource for tracking operations in many areas, including: logistics, security, controls, monitoring of things and people, etc. The acronym RFID (Radio Frequency Identification) refers to a technology for the identification and/or automatic storage of information relating to objects, animals or people, based on the ability to store data by specific electronic "labels", called "Tags" (or transponders), and on the their ability to reply to the remote interrogation by means of special fixed or portable equipment, called "readers" (or interrogators). This identification is made using radio frequency signals, which permit to communicate with such tags.

Attaching an RFID Tag to the objects subject to monitoring allows to uniquely identify them or possibly adding useful information, suitably stored in the Tag itself. Compared to previous technologies, an RFID element doesn't need to be in contact to be read, as it happens with magnetic strips, and, moreover, may not even be directly visible to be read, as it happens, instead, for barcodes. These characteristics have led to an exponential growth in the number and type of RFID carrying objects on the market and aroused the interest to develop further applications and to increase their functionality. A typical problem that has arisen is the localization of tagged RFID objects. Regardless of the presence or ancillary information recognition of labelled objects with RFID Tags, there are many applications in which it would be useful to integrate said information with a possibly accurate estimate of the position of said objects in the physical world. Over time, various solutions have been proposed to identify the position of an object provided with RFID Tag, some of which are based on the use of arrays of antennas (for example in US2011032101 or in US20010035815) rather than an array of Tags in which the object acts as a shielding element (as in US2004113787). Recently, multi-antenna solutions with multiplexing have been proposed (as in patent application US20140197991), or hybrid solutions, based on the co-utilization of magnetic sensors and RFID identification systems, such as (US20130328825 or US20110181289), as well as solutions that use the Tags as waypoint to identify the position of vehicles in a railway (as in EP2765468A2) or in a work area (as in US20100141483).

TECHNICAL FIELD

The spatial positioning of objects provided with RFID Tags within a defined space is often obtained by evaluating proximity to one or more RFID antennas (readers) which act as fixed points and from which, through suitable triangulations, it is possible to draw information about the relative (related to the antenna) and absolute (related to the system) position of the Tag. A measure of the proximity to the antenna is usually given by the intensity of the signal received by one or more receivers or by the interpolation of the information concerning the delay of the signal transmitted from the Tag to the receiving antennas; this system results to be rather complicated and imprecise because of known problems such as the mutual interferences, tolerance and non-uniformity of the measure corresponding to the variation of the object position inside the test field. Such problems increase even more dramatically as the number of identifiable objects increases in the field of action.

Moreover, additional problems are represented by the complexity and the high cost of the electronic infrastructure needed to triangulate the object position; indeed, in order obtain an adequately reliable reading, at least 3 different antennas must be employed (as in US2011032101), which are positioned in a suitable way in the working space, each connected to a different receiver unit or all connected to a same unit, through the interposition of an RF multiplexer system (as in US20140197991 and in US20010035815).

In case of very narrow spaces or, on the contrary, of extended surfaces, these methodologies can present considerable implementation problems, resulting in the need to use very sensitive (and expansive) systems to be able to detect even small differences in timing or signal strength, or to use a large is number of devices and/or antennas, to be able to properly cover the working space.

The use of hybrid solutions (such as US20130328825 or US20110181289) has also significant limitations and problems arising from the limited capacity of such systems to correctly discriminate and track the position and movement of multiple objects.

In particular, US20110181289 only allows the identification of a quite complex magnetic track at a time, preventing the discrimination among more objects that may be present, and the identification through RFID is, therefore, purely ancillary making it impossible to track the position and motion of each object independently.

Similarly, solutions such as US20130328825 do not allow to detect and track the movement on a surface of one or more objects, but merely to magnetically detect the presence or absence of portions of a single object having multiple magnets, being able, at most, to infer the spatial orientation; also this system is not, thus, able to track simultaneous movements of multiple objects, each identified by a unique RFID Tag.

Object of the present invention is a system for detecting the spatial positioning of one or more objects provided with RFID Tag, said objects possibly being positionable on a suitable sensorized surface, which constitutes the test area. The proposed system aims to provide a cost effective solution, easy to realize and having excellent performance to overcome the known problems.

DISCLOSURE OF THE INVENTION

Such objective is achieved realizing a suitable sensorized surface, on is which objects provided with RFID identifier can be positioned and possibly moved. Said sensorized surface houses a grid of magnetic sensors, placed in fixed and predetermined positions according to the peculiarities of the area of interest (overall area, precision of the detection required, presence of particular areas of interest, etc.).

The sensorized surface houses a RFID antenna dimensioned and positioned along its outer edges, so as to cover the entire area of interest, and able to read the Tags of possible objects, as they approach and enter the sensorized surface.

The localizable objects or elements, are also provided, in addition to a unique identifier RFID Tag, with a suitable magnet, adapted to interact with the above-mentioned grid of sensors. The analysis of the tagged objects, thus, occurs in two steps: the identification of the elements occurs by means of RFID techniques and, particularly, through the interaction between the Tag and the antenna, while the position detection of the tagged elements is obtained by the proximity detection (with maximum likelihood or interpolation techniques) of the magnet placed on the traceable object, by means of magnetic sensors positioned on the grid.

As a tagged object is approaching the test field, its identity is thus detected by means of RFID Tag, while the relative position, within the surface, is determined according to the magnetic sensor which is more excited in the grid, or by interpolating the values detected by the different excited sensors. Since these two detections are absolutely independent, it is necessary a logic and a suitable management system, which allow to reliably associate the RFID identity indicated by the antenna and the (magnetic) position detected by the grid of sensors. For this reason, there is a suitable control electronics, which is responsible for real-time monitoring of the information from antenna and grid of magnetic sensors and for managing and updating a database with current and historical data, inherent to the location and identity of the tagged objects within the test field. Such management is not limited to the mere acquisition of such information: a proper algorithm allows to evaluate and recognize particularly complex cases, such as multiple presences, insertion, movement or removal of a plurality of tagged objects, to be managed simultaneously and in a reliable manner.

BRIEF DESCRIPTION OF THE DRAWINGS

Further characteristics and advantages of the proposed technical solution will appear more evident in the following description of a preferred, but not exclusive, embodiment, shown by way of example and not limitation, in the accompanying 3 drawings, in which.

BEST MODE FOR CARRYING OUT THE INVENTION

Figure 1:
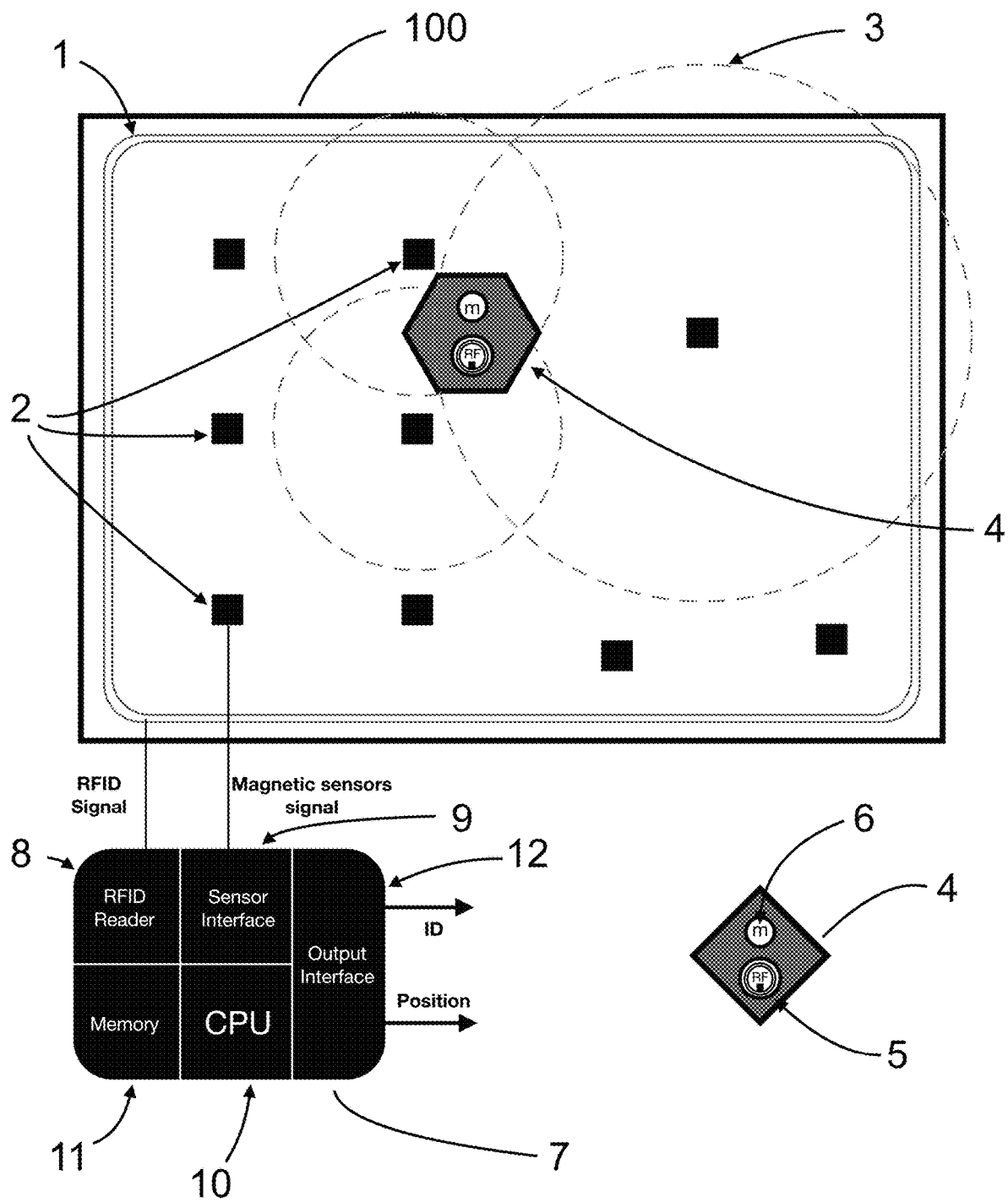
FIG. 1 schematically indicates the constituent elements of an embodiment.

With reference to the accompanying drawings, and particularly to FIG. 1 thereof, the components of the recognition and localization system are schematically identified and, in particular, a sensorized surface (100), intended to house mobile objects from which acquire information, which by way of example and not of limitation has been represented rectangular in shape, assuming a similar test field. A RFID antenna (1), is placed along the outer edges of the sensorized surface (100) to delimit the test area and an adequate number of magnetic sensors (2), are installed on said sensorized surface and placed in areas of interest each one characterized by a sensing area (3) partially overlapped, as shown in FIG. 1. Thanks to this structure, an object moving on said sensorized surface constantly excites at least one or more sensors, neighbour to the covered trajectory.

The objects (4) which must be identified and localized by the system may be freely positioned on or in proximity to said surface, each object being characterized by the presence of a unique RFID identifier (5) and by a magnet (6) which is able to excite the above-mentioned sensors. The system is provided with a suitable control electronics (7), which acquires the signals of the magnetic sensors and the RFID antenna, to process the results and remotely transmit the information (identity and position) of the objects on the base. The control electronics includes a RFID reader (8), an interface (9) for the acquisition of the different position sensors (2) implemented on the surface (100), a programmable computing unit (10) to process data, a memory (11) to store the information related to current and previous positions of the tracked objects, and an output interface (12) to transmit to third-party devices the information about identification and positioning of the tracked objects.

From the functional point of view, when an object (4) provided with RFID Tag (5) and characterized by the presence of a magnet (6), approaches the sensorized surface, the system, recognizes its presence by means of the RFID antenna (1), which detects the presence within the test area and, thus, recognizes its identity by reading the unique identifier associated with the TAG.

Figure 2:
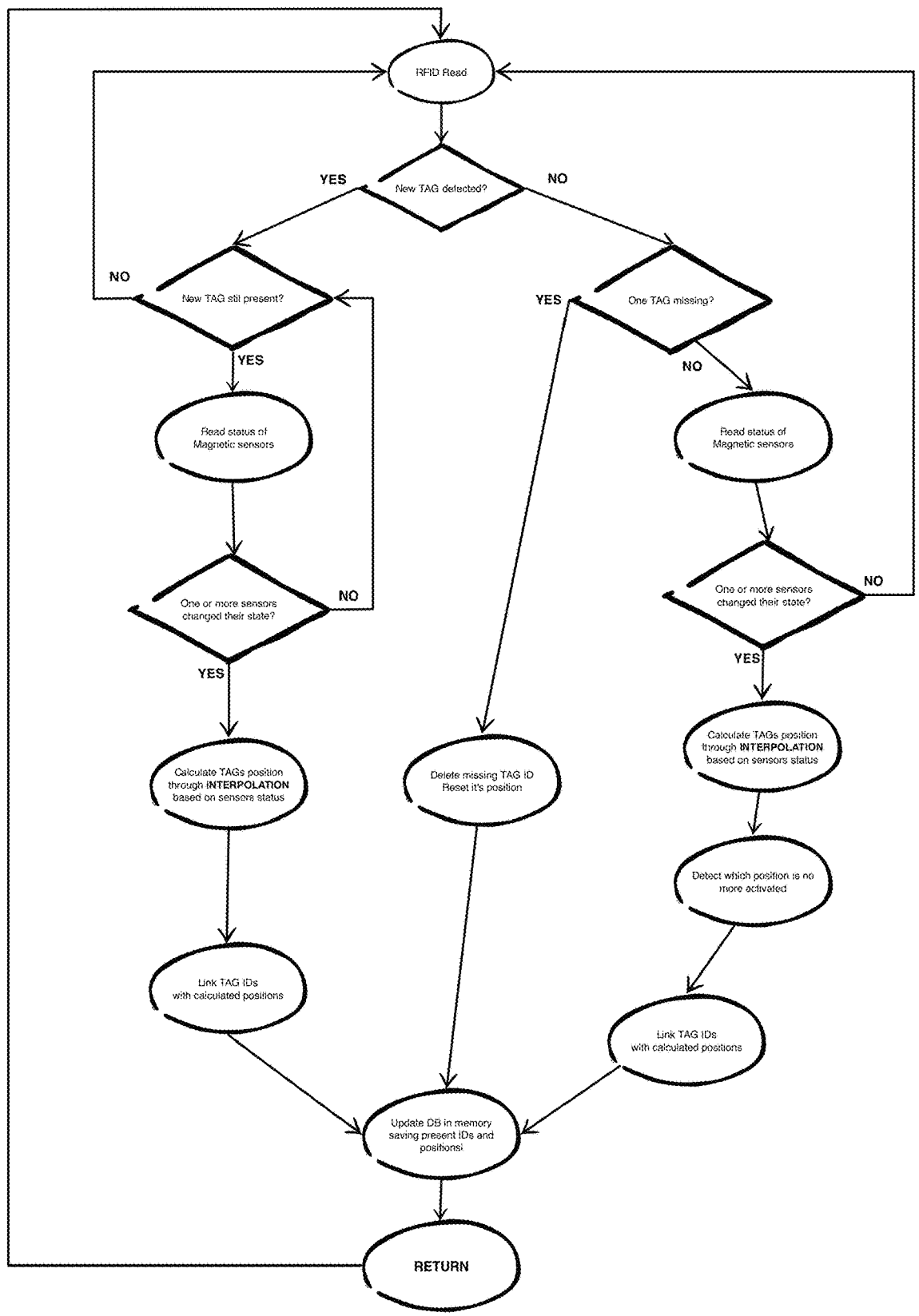
FIG. 2 indicates the algorithm executed by the control electronics of the proposed system.

Following the positioning over the sensorized surface (100), or in proximity to it, the magnet (6) interacts with the surface and excites one or more sensors (2) belonging to a pre-made grid and in particular those positioned in proximity to the object itself, or, rather within the sensing area (3) in which the object is found. Both the information types related to the RFID Tags received by the antenna and to the signal from (either excited or not) magnetic sensors, are transmitted to the control unit (7) for the subsequent processing. Following every new insertion, removal or movement of tagged elements inside the reading range of the sensorized surface (100), the control unit processes and updates the mapping of the identified and localized elements, according to a suitable management algorithm. With reference to the accompanying drawings, and particularly to FIG. 2 thereof, the above-mentioned algorithm is shown in detail together with the related actions and decisions on the basis of the information (identifier and position) provided by the sensorized test surface.

Said algorithm comprises the following steps:
Acquiring the RFID data from the RFID reader (8)
Acquiring the data related to the magnetic sensors obtained from their interface (9)
Calculating the positions occupied by the objects by interpolating the data from magnetic sensors and comparing with the positioning data previously detected.
Matching the identification data with the position data for each object (4) positioned on the sensorized surface (100)
Saving the new position data in the memory (11)
Transmitting remotely the identification and position information of the marked objects (4) by means of the output interface (12)

Figure 3:
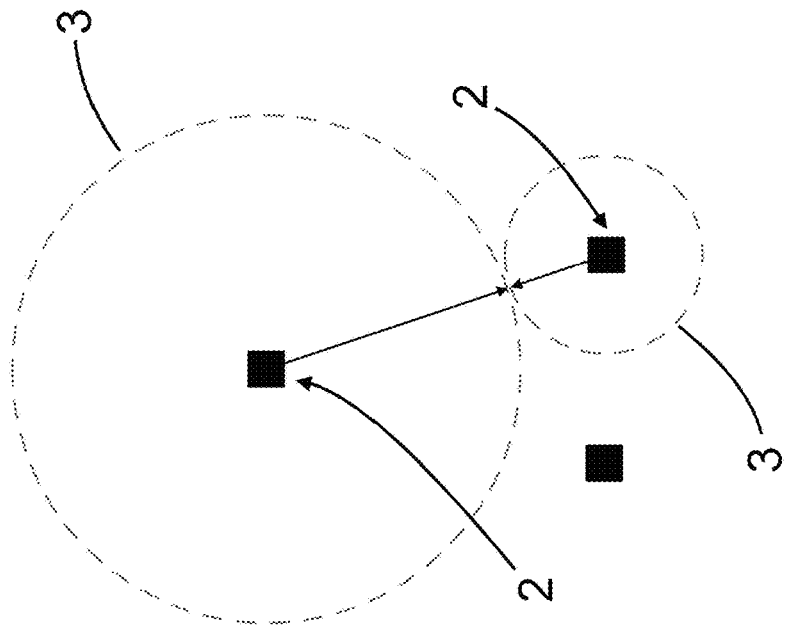
FIG. 3 graphically represents the applied interpolation methods of the system depending on whether the employed sensors are of analogue or discrete type.
Figure 3:
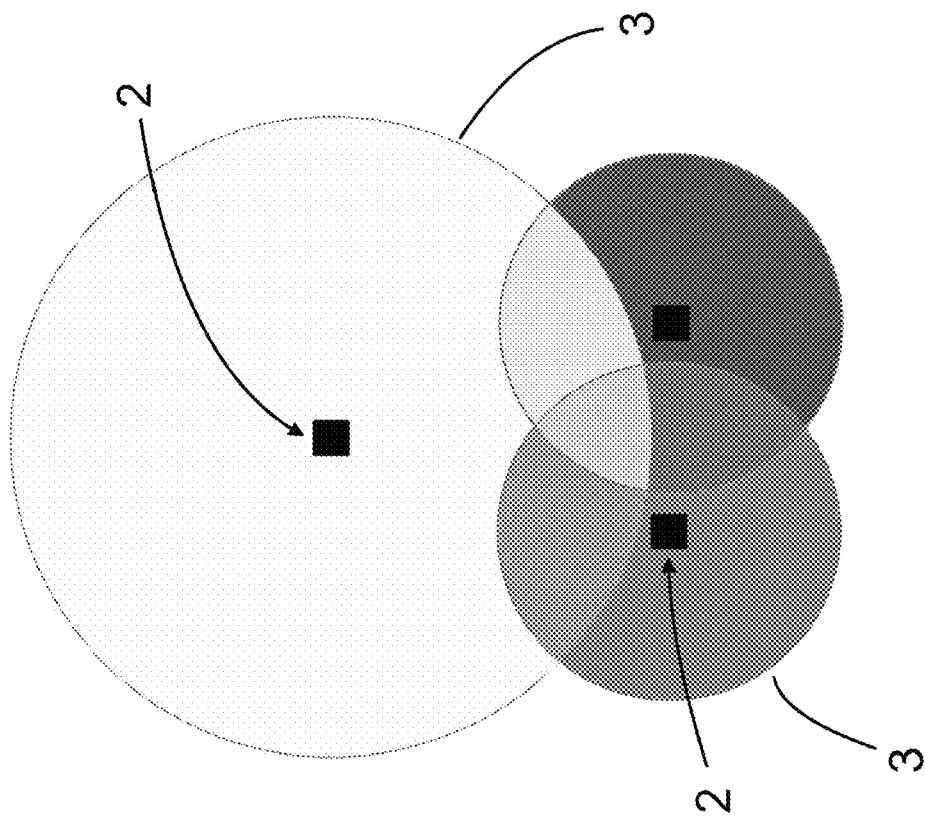

With reference to the accompanying drawings, and particularly to FIG. 3 thereof, the method employed in the above-mentioned algorithm for calculating the positions occupied by the objects (4) through interpolation of the data of the magnetic sensors (2) is represented in detail.

The presence of objects (4) in intermediate positions among more magnetic sensors (2) necessarily involves that a same object may fall within several sensing areas (3) and, thus, it excites a plurality of sensors. In this case, the task of the algorithm is to evaluate the state of excitation of the various sensors involved and to estimate the position of the object by means of interpolation techniques. Such techniques differ according to the type of magnetic sensors (2) employed.

In case of data from the magnetic sensor (2) of discrete type, the interpolation occurs by assigning to each object an approximate position, corresponding to the portion of the test surface identified by the intersection between the sensing areas (3) of the sensors, either excited or not, according to the following formula:

Position=(Intersection of sensors ON)−(Combination of the sensors OFF).

In case of data from magnetic sensors (2) of analogue type, the interpolation is carried out by assigning to each object a position calculated by triangulation of the intensity of the signals measured by the excited magnetic sensors.

INDUSTRIAL APPLICABILITY AND IMPLEMENTATION OPTIONS

The invention can be realized with technical equivalents, with supplementary materials or solutions suitable for the purpose and the application scope.

By way of example and not limitation, it is noted that the geometric shapes of the involved parts may be varied while maintaining the functionality. In particular, the shape of the surface may change according to the corresponding space to be monitored and within which identify tagged objects. Moreover, the grid of magnetic sensors may vary, which by way of example have been represented in homogeneous and equidistant manner, but which may vary by number, density and spatial location depending on the accuracy of the required detection or the presence of particular areas of interest (e.g. a pad with macro areas the objects have to be inserted). At the hardware level, it will be possible to change the types of RFID Tags and magnetic sensors, provided that the above-mentioned basic functions are maintained, i.e. identification (via antenna and RFID Tag) and position detection by means of magnetic sources and sensors). In particular, the magnetic sensors could be implemented with various hardware solutions able to provide analogue (e.g. by means of Hall-effect sensors) or digital data (e.g. by means of Reed switches). By varying these implementations, it will be necessary to change the conditioning and acquisition circuits, without, however, departing from the purpose and scope of application of the proposed invention.

ADVANTAGES OF THE INVENTION

The proposed solution is simple, accurate, cost-effective and easy to assemble; it allows to obtain, through a hybrid (RFID and magnetic) sensing system and a suitable electronic control provided with a control algorithm, an effective identification and localization of one or more suitably RFID tagged objects and dynamically positioned inside a base, representing the space of useful test. Moreover, the proposed solution allows to track the movements of the single objects positioned above the test surface, even in the presence of more objects, allowing to avoid the typical problems inherent to the location of objects based on estimates of the only RFID signal with multiple antenna systems and overcoming the limits of the other hybrid solutions (RFID and magnetic sensors) proposed so far.

SCOPE OF THE INVOKED PROTECTION

The proposed solution is applicable to systems for the spatial recognition of one or more objects characterized in magnetic and radio frequency terms and positionable at the user's discretion on or in proximity to a suitable base associated with the considered test space.

The invention claimed is:

1. System for detecting positioning and movement of one or more objects (4), characterized by:
a sensorized surface (100), provided with a single radio frequency identification antenna (1), placed along its outer edges, magnetic sensors (2) placed within said sensorized surface, whose sensing areas (3), cover partially overlapping each other, said sensorized surface (100), a series of trackable objects (4) provided with a magnetic marker (6) configured to interact with the surface and to magnetically excite at least one of said magnetic sensors and a radio frequency identification TAG (5) for interacting with said antenna, an electronic control circuitry (7) comprising the following elements:
 a) a radio frequency identification reader (8) for reading the identification data of the radio frequency identification TAGs,
 b) an apparatus (9) for acquiring the signals generated by the magnetic sensors (2) in response to magnetic excitation caused by said magnetic marker,
 c) a memory unit (11) for storing current and historical position information of the tracked objects (4),
 d) an output interface (12) for transmitting identification and position information for each object to third-party devices,
 e) a programmable computing unit (10) for correlating the identification data to the magnetic position data, characterized by an algorithm consisting in the following steps:
  Acquiring the identification data from the radio frequency identification reader (8)
  Acquiring the data of the magnetic sensors from their interface (9)
  Calculating the positions occupied by the objects by interpolating the data from magnetic sensors and comparing with the positioning data previously detected,
  Matching the identification data with the position data for each object (4) positioned on the sensorized surface (100)
  Saving the new position data in the memory (11)
  Transmitting remotely the identification and position information of the marked objects (4) by means of the output interface (12)
wherein said magnetic sensors are of discrete type and said programmable computing unit performs the interpolation of data from such discrete sensors, by assigning to each object an approximate position, according to the following formula:

Position=(Intersection of sensors ON)−(Combination of the sensors OFF)

2. System according to claim 1, wherein said magnetic sensors (2) are characterized by a spatial distribution of their sensing areas (3) allowing the coverage of the entire sensorized surface (100) enclosed by the perimeter of the radio frequency identification antenna (1).

3. System according to claim 1, wherein said memory unit (11) records current and previous position information for each marked object (4).

4. System according to claim 1, wherein said magnetic sensors (2) are of analogue type and said programmable computing unit (10) performs the interpolation of data from such analogue sensors by means of triangulation.

* * * * *